United States Patent
Luoh et al.

(10) Patent No.: US 8,034,691 B2
(45) Date of Patent: Oct. 11, 2011

(54) HDP-CVD PROCESS, FILLING-IN PROCESS UTILIZING HDP-CVD, AND HDP-CVD SYSTEM

(75) Inventors: Tuung Luoh, Hsinchu (TW); Chin-Ta Su, Hsinchu (TW); Ta-Hung Yang, Hsinchu (TW); Kuang-Chao Chen, Hsinchu (TW); Shing-Ann Luo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 12/193,442

(22) Filed: Aug. 18, 2008

(65) Prior Publication Data

US 2010/0041245 A1    Feb. 18, 2010

(51) Int. Cl.
*H01L 21/336* (2006.01)
(52) U.S. Cl. ........ 438/296; 438/221; 438/424; 438/700; 257/E21.546; 257/E21.628
(58) Field of Classification Search .......... 438/219, 438/295, 359; 257/E21.574
See application file for complete search history.

(56) References Cited

U.S. PATENT DOCUMENTS

| | | | |
|---|---|---|---|
| 6,423,653 B1 | 7/2002 | Fu et al. | |
| 6,803,271 B2 | 10/2004 | Fujiwara et al. | |
| 7,033,907 B2 | 4/2006 | Kim | |
| 7,062,662 B2 | 6/2006 | Gauthier et al. | |
| 7,208,426 B2 | 4/2007 | Huang et al. | |
| 7,229,912 B2 | 6/2007 | Kim | |
| 2005/0035379 A1 | 2/2005 | Saito | |
| 2005/0118784 A1* | 6/2005 | Kim | 438/424 |
| 2005/0159007 A1* | 7/2005 | Chen et al. | 438/700 |
| 2006/0014377 A1* | 1/2006 | Kim | 438/623 |
| 2006/0105114 A1* | 5/2006 | White | 427/569 |
| 2007/0212874 A1* | 9/2007 | Sandhu | 438/637 |

FOREIGN PATENT DOCUMENTS

| | | |
|---|---|---|
| TW | 00329550 | 4/1998 |
| TW | 00480569 | 3/2002 |
| TW | 200409301 | 6/2004 |
| TW | 200707636 | 2/2007 |

* cited by examiner

*Primary Examiner* — Cheung Lee
(74) *Attorney, Agent, or Firm* — J.C. Patents

(57) ABSTRACT

An HDP-CVD process is described, including a deposition step conducted in an HDP-CVD chamber and a pre-heating step that is performed outside of the HDP-CVD chamber before the deposition step and pre-heats a wafer to a temperature higher than room temperature and required in the HDP-CVD process deposition step.

9 Claims, 2 Drawing Sheets

HDP-CVD PROCESS, FILLING-IN PROCESS UTILIZING HDP-CVD, AND HDP-CVD SYSTEM

BACKGROUND OF THE INVENTION

1. Field of Invention

This invention relates to a semiconductor process, and more particularly relates to a high-density-plasma CVD (HDP-CVD) process, to a filling-in process utilizing HDP-CVD, and to an HDP-CVD system applicable to the HDP-CVD process.

2. Description of Related Art

As the linewidth of integrated circuit (IC) fabricating process is much reduced, the HDP-CVD technique is widely used in depositions of various materials, especially insulating materials, due to its gap-filling capability. An HDP-CVD process has both a deposition effect and an etching effect, wherein the etching effect is largest at the gap corners so that the material is well filled in the gaps.

Moreover, to improve the quality of the deposited film, a wafer is usually pre-heated in-situ in the HDP-CVD chamber before the deposition is started. However, since plasma is generated in the pre-heating step in the HDP-CVD chamber, the wafer surface is easily damaged by the ion bombardment from the plasma.

SUMMARY OF THE INVENTION

Accordingly, this invention provides an HDP-CVD process that can improve the quality of the material deposited without damaging the wafer surface.

This invention also provides a filling-in process utilizing HDP-CVD, which can also improve the quality of the deposited material without damaging the wafer surface.

This invention also provides an HDP-CVD system applicable to an HDP-CVD process of this invention.

The HDP-CVD process of this invention includes a deposition step conducted in an HDP-CVD chamber and a pre-heating step that is conducted outside of the HDP-CVD chamber before the deposition step and pre-heats a wafer to a temperature higher than room temperature and required in the deposition step.

In an embodiment, the wafer is pre-heated in a pre-heating chamber, possibly together with at least one other wafer.

The filling-in process of this invention is described as follows. A liner layer is formed on a wafer having recesses thereon. An HDP-CVD process is then performed to the wafer, including a deposition step conducted in an HDP-CVD chamber and a pre-heating step conducted in the HDP-CVD chamber before the deposition step to pre-heat the wafer to a temperature higher than room temperature and required in the deposition step. The liner layer is formed outside of the HDP-CVD chamber.

The HDP-CVD system of this invention includes an HDP-CVD chamber for depositing a material on a wafer and pre-heating means outside of the HDP-CVD chamber. The pre-heating means is for pre-heating the wafer, before the wafer is loaded into the chamber, to a temperature higher than room temperature and required in an HDP-CVD process to be conducted in the HDP-CVD chamber.

In an embodiment, the pre-heating means is a pre-heating chamber, which may be one capable of pre-heating only one wafer each time or one capable of pre-heating two or more wafers simultaneously.

Since the wafer is pre-heated before being subjected to HDP-CVD, the film quality is improved. Meanwhile, since the wafer is pre-heated outside of the HDP-CVD chamber or is formed with a liner layer thereon before the pre-heating step conducted in the HDP-CVD chamber, device damage due to plasma ion bombardment is prevented. Moreover, in an embodiment where the wafer is pre-heated outside of the HDP-CVD chamber together with at least one other wafer, not only plasma damage is prevented in the pre-heating step of the HDP-CVD process, but also the time required for separately pre-heating the wafers in the HDP-CVD chamber in the prior art can be saved so that the wafer-per-hour (WPH) value is increased.

In order to make the aforementioned and other objects, features and advantages of the present invention comprehensible, a preferred embodiment accompanied with figures is described in detail below.

DESCRIPTION OF EMBODIMENTS

Figure 1:
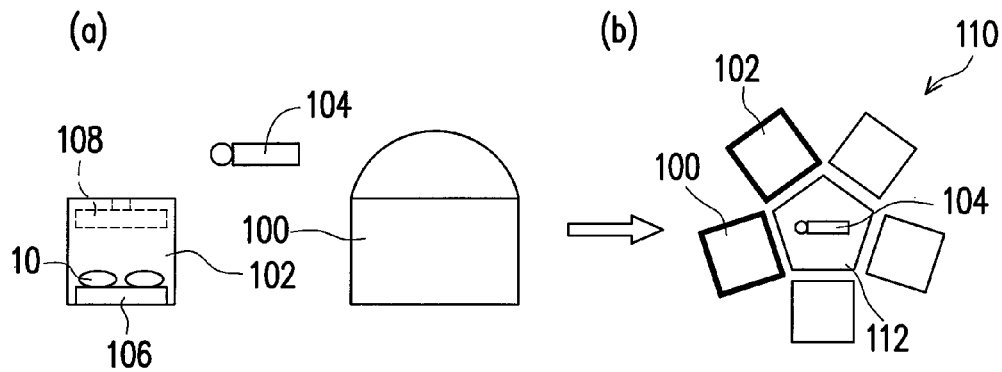
FIG. 1($a$) illustrates an HDP-CVD system according to a first embodiment of this invention and FIG. 1($b$) a cluster tool incorporating the HDP-CVD system.

FIG. 1($a$) illustrates an HDP-CVD system according to the first embodiment of this invention and FIG. 1($b$) a cluster tool incorporating the HDP-CVD system.

Referring to FIG. 1($a$), the HDP-CVD system includes an HDP-CVD chamber 100 for conducting a deposition step that deposits a material, such as an insulating material like silicon oxide, on a wafer, a pre-heating chamber 102 as pre-heating means for conducting a pre-heating step outside of the HDP-CVD chamber 100, and wafer transfer means 104. The pre-heating chamber 102 is for pre-heating the wafer, before the wafer is loaded into the HDP-CVD chamber 100, to a temperature higher than room temperature and required in the deposition step to be conducted in the chamber 100.

The pre-heating chamber 102 may be equipped with a heating plate 106 or a heating lamp 108 for pre-heating the wafer, and may have a capacity of only one wafer 10 or a capacity allowing two or more wafers 10 of the same lot to be pre-heated therein simultaneously. For example, when the pre-heating chamber 102 allow N wafers to be pre-heated therein at the same time and the pre-heating of each wafer takes M minutes, about (N−1)×M minutes can be saved as compared with the prior art where each wafer is pre-heated in the HDP-CVD chamber for M minutes. In addition, the wafer transfer means 104 is usually a robot.

The material of the heating plate 106 may be a ceramic material selected from the group consisting of aluminum nitride (AlN), $Si_3N_4$ and $Al_2O_3$. The heating lamp 108 is often an IR lamp that provides a clean heat source not contacting the wafer. For example, a quartz halogen lamp can reach 90% of the full operating temperature within 3 seconds from a cold start and cool down instantly in response to power control signals, wherein the radiant energy lowers to 10% at 5 seconds after the power is disconnected. The lamp power and heating time are two critical parameters in the recipe. The power must be high enough to heat the wafer to the target temperature, but must not be too high for rapid heating may alter electrical characteristics of existing films. A common recipe used in the fab where this study was conducted heated the wafer at 350-600° C.

Referring to FIG. 1(b), the HDP-CVD chamber 100 and the pre-heating chamber 102 may be integrated in a cluster tool 110 while the wafer transfer means 104 placed in a loading room 112 of the cluster tool 110. Thus, a wafer 10 can be prevented from contacting the outer atmosphere during its transfer and is protected from contamination and/or oxidation thereby.

Figure 2A:
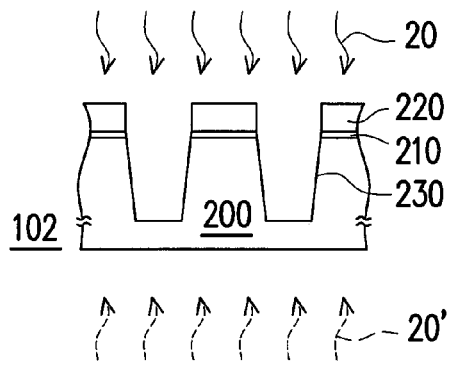
FIGS. 2A-2C illustrate an exemplary application of an HDP-CVD process of this invention to a shallow trench isolation (STI) process according to an example of the first embodiment of this invention.
Figure 2B:
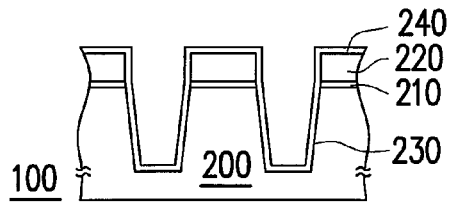
Figure 2C:
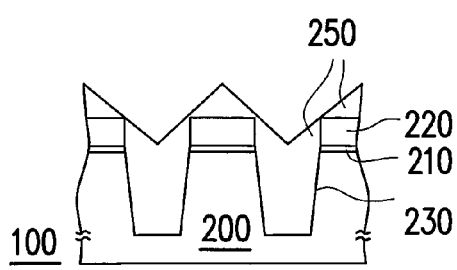

FIGS. 2A-2C illustrate an exemplary application of an HDP-CVD process of this invention to an STI process according to an example of the first embodiment.

Referring to FIG. 2A, a wafer 200 formed with a mask layer 220 thereon and with trenches 230 of an STI structure therein is loaded into the pre-heating chamber 102 and subjected to pre-heating 20/20' in the pre-heating step. The trenches 230 were previously defined with the mask layer 220 as a mask, the mask layer 220 may include silicon nitride, and a pad oxide layer 210 may be formed on the wafer 200 before the mask layer 220 is formed. In the pre-heating chamber 102, the wafer 200 may be subjected to pre-heating 20 from above or pre-heating 20' from under, which may be applied by a heating lamp or a heating plate described above.

In the pre-heating step, the wafer 200 is pre-heated to have a temperature higher than room temperature and required in the deposition step to be conducted in the HDP-CVD chamber 100. For example, when the insulating material to be deposited as the STI material is silicon oxide, the temperature to which the wafer 200 is pre-heated is usually between 300° C. and 800° C. The pre-heating chamber 102 may have a capacity of only one wafer or a capacity of two or more wafers. With a pre-heating chamber 102 having a capacity of two or more wafers, it is possible to pre-heat the wafer 200 together with at least one other wafer simultaneously to reduce the pre-heating time.

Referring to FIGS. 2B and 2C, after the wafer 200 is pre-heated to a required temperature, it is transferred into the HDP-CVD chamber 100, in which a deposition step is conducted to deposit an insulating layer 250 on the wafer 200 filling up the trenches 230. In some cases, a liner layer 240 is formed on the wafer 200 in an initial deposition stage of the deposition step before the main deposition stage of the same, as shown in FIG. 2B, wherein the etching rate in the initial deposition stage is lower than that in the main deposition stage so that the surface of the wafer 200 is further prevented from plasma damage. As silicon oxide is to be deposited, the reaction gas may include $SiH_4$, $O_2$ and Ar, and the temperature to which the wafer 200 is pre-heated is usually 300°-800° C., preferably 350-500° C. and particularly preferably 400-450° C.

Figure 3A:
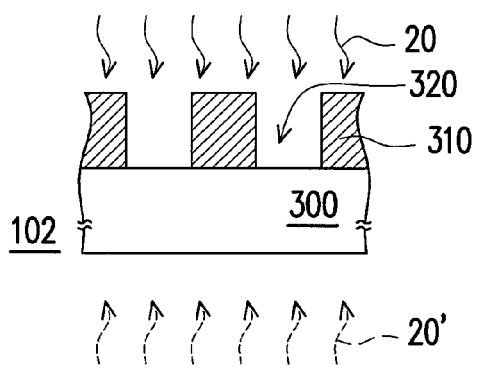
FIGS. 3A-3C illustrate an exemplary application of an HDP-CVD process of this invention to an inter-layer dielectric (ILD) process according to another example of the first embodiment of this invention.
Figure 3B:
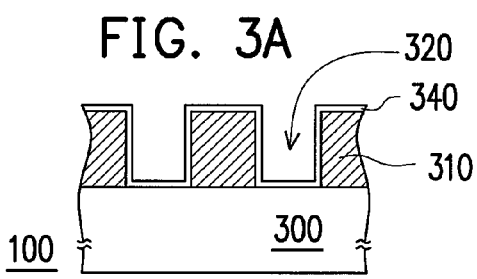
Figure 3C:
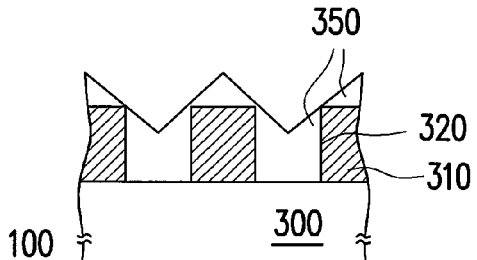

FIGS. 3A-3C illustrate an exemplary application of an HDP-CVD process of this invention to an ILD process according to another example of the first embodiment.

Referring to FIG. 3A, a wafer 300 formed with conductive lines 310 thereon is loaded in the pre-heating chamber 102 and subjected to pre-heating 20/20' in the pre-heating step, wherein the trenches 320 are present between the conductive lines 310. The conductive lines 310 may include a metal. In the pre-heating chamber 102, the wafer 300 may be subjected to pre-heating 20 from above or pre-heating 20' from under, which may applied by a heating lamp or a heating plate mentioned above.

The wafer 300 is pre-heated to have a temperature higher than room temperature and is required in the deposition step to be conducted in the HDP-CVD chamber 100. For example, when the conductive lines 310 include metal and the insulating material to be deposited as an ILD material is SiO, the temperature to which the wafer 300 is pre-heated is 300-500° C. Moreover, the pre-heating chamber 102 may have a capacity of only one wafer or a capacity of two or more wafers. By using a pre-heating chamber 102 with a capacity of two or more wafers, it is possible to pre-heat the wafer 300 together with at least one other wafer simultaneously to save the pre-heating time.

Referring to FIGS. 3B and 3C, after the wafer 300 is pre-heated to a required temperature, it is transferred into the HDP-CVD chamber 100, in which a deposition step is conducted to deposit an insulating layer 350 on the wafer 300 filling in the trenches 320. In a case, the etching rate in an initial deposition stage of the deposition step is lower than that in a main deposition stage of the same, so that a liner layer 340 is formed on the wafer 300 in the initial deposition stage, as shown in FIG. 3B, and thus the surface of the wafer 300 is further prevented from damage caused by plasma.

Figure 4:
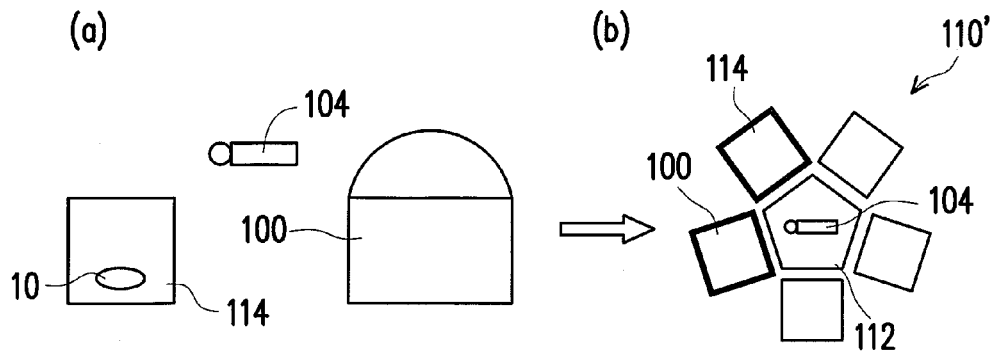
FIG. 4($a$) illustrates a system for conducting a filling-in process according to a second embodiment of this invention and FIG. 4($b$) a cluster tool including the system.

FIG. 4(a) illustrates a system for conducting a filling-in process according to the second embodiment of this invention and FIG. 4(b) a cluster tool including the system.

Referring to FIG. 4(a), the system includes an HDP-CVD chamber 100 for conducting a pre-heating step and a deposition step, a chamber 114 for forming a liner layer on a wafer 10 before the pre-heating step, and wafer transfer means 104. In this embodiment, the HDP-CVD chamber 100 is set to pre-heat the wafer 10 to a temperature required in the deposition step to be conducted therein.

When the material to be deposited with HDP-CVD is silicon oxide, the chamber 114 may be one capable of depositing high-temperature oxide (HTO) or one capable of depositing silicon oxide through plasma-enhanced chemical vapor deposition (PECVD). The HTO may be formed through low-pressure chemical vapor deposition (LPCVD). As in the first embodiment, the wafer transfer means 104 is usually a robot.

Referring to FIG. 4(b), the HDP-CVD chamber 100 and the chamber 114 may also be integrated in a cluster tool 110' while the wafer transfer means 104 placed in a loading room 112 of the cluster tool 110' as in the first embodiment. Thus, a wafer 10 can be prevented from contacting the outer atmosphere during its transfer and is protected from contamination and/or oxidation thereby.

Figure 5A:
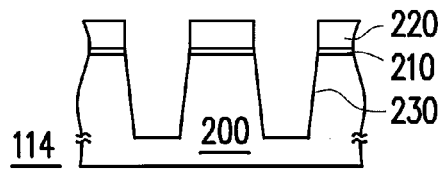
FIGS. 5A-5C illustrate an exemplary application of a filling-in process of this invention to a shallow trench isolation (STI) process according to an example of the second embodiment of this invention.
Figure 5B:
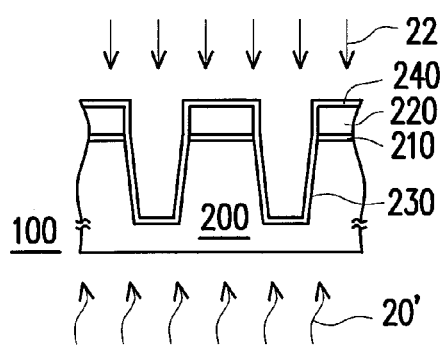
Figure 5C:
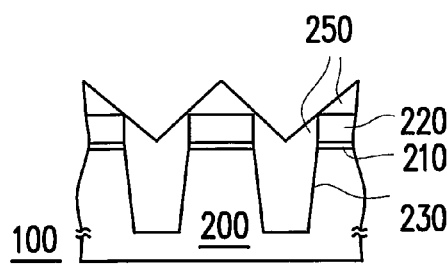

FIGS. 5A-5C illustrate an exemplary application of a filling-in process of this invention to an STI process according to an example of the second embodiment.

Referring to FIG. 5A, a wafer 200 formed with a mask layer 220 thereon and with trenches 230 of an STI structure therein is provided, wherein a pad oxide layer 210 may be formed on the wafer 200 before the mask layer 220 is formed. After the wafer 200 is loaded into the chamber 114, a liner layer 240 is formed thereon. When the material to be deposited with HDP-CVD is silicon oxide, the material of the liner layer 240 may be high-temperature oxide (HTO) or silicon oxide formed through PECVD.

The HTO may be formed through LPCVD using SiH$_4$ and N$_2$O as reaction gases at a temperature of 550-850° C., preferably 650-800° C. and more preferably 700-800° C., under a pressure of 0.1-400 Torr, preferably 0.5-300 Torr and more preferably 50-200 Torr. The PECVD process may use SiH$_4$ and N$_2$O as reaction gases and may be conducted with a power of 50-1000 W, preferably 50-500 W and more preferably 100-300 W, at 250-550° C., preferably 300-500° C. and more preferably 375-425° C., under a pressure of 0.1-100 Torr, preferably 2-20 Torr and more preferably 4-15 Torr.

Referring to FIG. 5B, the wafer 200 is then moved out of the chamber 114 and loaded into the HDP-CVD chamber 100, and a pre-heating step 20' inherently with plasma generation and ion bombardment 22 is conducted in the HDP-CVD chamber 100 to pre-heat the wafer 10 to a temperature required in the deposition step to be conducted in the HDP-CVD chamber 100. For example, when the insulating material to be deposited on the wafer 200 as the material of the STI structure is silicon oxide, the temperature to which the wafer is pre-heated is usually between 300° C. and 800° C. Since a liner layer 240 has been formed on the wafer 200, the devices on the wafer 200 are prevented from being damaged by the plasma ion bombardment 22.

Referring to FIGS. 5B-5C, after the wafer 200 is pre-heated to the required temperature, a deposition step is conducted in the HDP-CVD chamber 100 to deposit an insulating layer 250 on the wafer 200 filling up the trenches 230. When silicon oxide is to be deposited, the reaction gas may include SiH$_4$, O$_2$ and Ar.

Figure 6A:
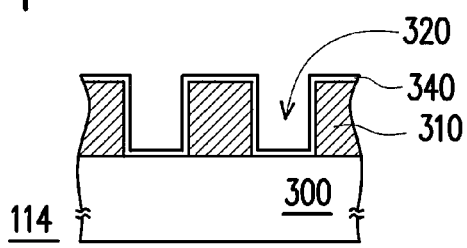
FIGS. 6A-6C illustrate an exemplary application of a filling-in process of this invention to an inter-layer dielectric (ILD) process according to another example of the second embodiment of this invention.
Figure 6B:
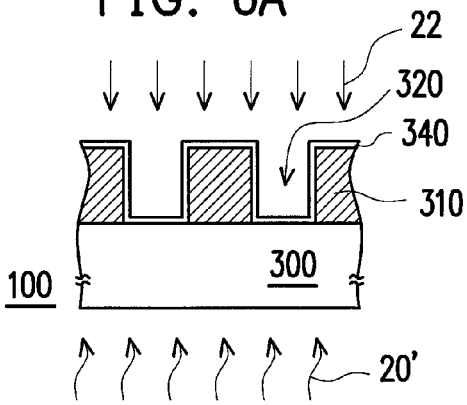
Figure 6C:
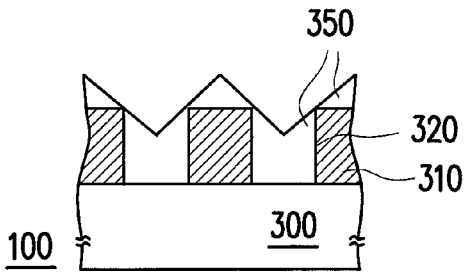

FIGS. 6A-6C illustrate an exemplary application of a filling-in process of this invention to an ILD process according to another example of the second embodiment.

Referring to FIG. 6A, a wafer 300 formed with conductive lines 310 thereon is provided, wherein trenches 320 are present between the conductive lines 310 and the conductive lines 310 may include metal. After the wafer 200 is loaded in the chamber 114, a liner layer 240 is formed on the wafer 200. When the material to be deposited with HDP-CVD is silicon oxide, the material of the liner layer 240 may be silicon oxide formed with a PECVD process, which may use SiH$_4$ and N$_2$O as reaction gases and may be done with a power of 30-2000 W, preferably 50-500 W and more preferably 100-300 W, at 250-550° C., preferably 300-500° C. and more preferably 375-425° C., under a pressure of 0.1-100 Torr, preferably 2-20 Torr and more preferably 4-15 Torr.

Referring to FIG. 6B, the wafer 300 is moved out of the chamber 114 and loaded in the HDP-CVD chamber 100, in which a pre-heating step is conducted to pre-heat the wafer 300 to a temperature required in the deposition step to be conducted in the HDP-CVD chamber 100. For example, when the conductive lines 310 include metal and the insulating material to be deposited as the material of the ILD layer is silicon oxide, the temperature to which the wafer 300 is pre-heated is between 300° C. and 500° C.

Referring to FIGS. 6B-6C, after the wafer 300 is pre-heated to the required temperature, a deposition step is conducted in the HDP-CVD chamber 100 to deposit an insulating layer 350 on the wafer 300 filling in the trenches 320.

Since the wafer is pre-heated before being loaded into the HDP-CVD chamber or is formed with a liner layer thereon before the pre-heating step conducted in the HDP-CVD chamber, the film quality is improved. Meanwhile, since the wafer is pre-heated outside of the HDP-CVD chamber, device damage due to plasma ion bombardment is prevented. Moreover, in cases where the wafer is pre-heated outside of the HDP-CVD chamber together with at least one other wafer, not only plasma damage is prevented in the pre-heating step of the HDP-CVD process, but also the time required for separately pre-heating the wafers in the HDP-CVD chamber in the prior art can be saved so that the wafer-per-hour (WPH) value is increased.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A high-density-plasma chemical vapor deposition (HDP-CVD) process, comprising: a deposition step conducted in an HDP-CVD chamber, and a pre-heating step that is performed in a pre-heating chamber outside of the HDP-CVD chamber before the deposition step and pre-heats a wafer to a temperature higher than room temperature and required in the deposition step, wherein the wafer has been formed with a trench and a liner layer in the trench before being pre-heated, and the pre-heating chamber is equipped with a heating lamp for the pre-heating.

2. The HDP-CVD process of claim 1, wherein the pre-heating chamber and the HDP-CVD chamber are integrated in a cluster tool.

3. The HDP-CVD process of claim 1, wherein the wafer is pre-heated together with at least one other wafer in the pre-heating step.

4. The HDP-CVD process of claim 1, which deposits an insulating material in the deposition step.

5. The HDP-CVD process of claim 4, wherein the trench comprises a trench of a shallow trench isolation structure.

6. The HDP-CVD process of claim 4, wherein the trench comprises a trench defined by conductive lines.

7. The HDP-CVD process of claim 4, wherein the insulating material is silicon oxide.

8. The HDP-CVD process of claim 7, wherein the temperature is between 300° C. and 800° C.

9. The HDP-CVD process of claim 7, wherein the insulating material is deposited with a reaction gas comprising SiH$_4$, O$_2$ and Ar at least.

* * * * *